(12) United States Patent
Yoon et al.

(10) Patent No.: US 8,154,119 B2
(45) Date of Patent: Apr. 10, 2012

(54) COMPLIANT SPRING INTERPOSER FOR WAFER LEVEL THREE DIMENSIONAL (3D) INTEGRATION AND METHOD OF MANUFACTURING

(75) Inventors: Sang Won Yoon, Ann Arbor, MI (US); Koji Shiozaki, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 218 days.

(21) Appl. No.: 12/751,980

(22) Filed: Mar. 31, 2010

(65) Prior Publication Data

US 2011/0241196 A1 Oct. 6, 2011

(51) Int. Cl.
*H01L 23/34* (2006.01)
*H01L 23/12* (2006.01)

(52) U.S. Cl. ........ 257/727; 257/718; 257/698; 257/704; 257/737; 257/774; 257/E23.011; 257/E23.078; 361/787

(58) Field of Classification Search .................. 257/727, 257/718, 704, 774, 698, 737, E23.011, E23.078; 361/787
See application file for complete search history.

(56) References Cited

U.S. PATENT DOCUMENTS

| | | | |
|---|---|---|---|
| 5,152,695 A * | 10/1992 | Grabbe et al. ............... 439/71 |
| 5,166,774 A * | 11/1992 | Banerji et al. ............... 361/749 |
| 5,225,633 A | 7/1993 | Wigginton | |
| 5,280,139 A * | 1/1994 | Suppelsa et al. ............ 174/260 |
| 5,416,429 A * | 5/1995 | McQuade et al. ........ 324/754.07 |
| 5,613,861 A * | 3/1997 | Smith et al. .................... 439/81 |
| 5,847,572 A * | 12/1998 | Iwasaki et al. ............ 324/754.08 |
| 6,303,992 B1 | 10/2001 | Van Pham et al. | |
| 6,330,164 B1 * | 12/2001 | Khandros et al. ............. 361/760 |
| 6,529,022 B2 | 3/2003 | Pierce | |
| 6,790,684 B2 * | 9/2004 | Ahn et al. ...................... 438/14 |
| 6,836,011 B2 * | 12/2004 | Azuma ........................ 257/700 |
| 6,845,901 B2 | 1/2005 | Koopmans | |
| 6,864,588 B2 | 3/2005 | Hung | |
| 6,937,037 B2 | 8/2005 | Eldridge et al. | |
| 6,958,531 B2 | 10/2005 | Ucok et al. | |
| 6,975,518 B2 * | 12/2005 | Frutschy et al. ............... 361/769 |
| 7,301,358 B2 | 11/2007 | Jovanovic et al. | |
| 7,396,236 B2 | 7/2008 | Eldridge et al. | |
| 7,511,521 B2 | 3/2009 | Richmond, II et al. | |
| 7,579,848 B2 | 8/2009 | Bottoms et al. | |
| 7,583,101 B2 | 9/2009 | Miller | |
| 2003/0099097 A1 * | 5/2003 | Mok et al. ..................... 361/767 |
| 2003/0173499 A1 | 9/2003 | Cole et al. | |

(Continued)

OTHER PUBLICATIONS

Hikasa, K.; "Development of Flexible Bumped Tape Interposer"; Furukawa Review; No. 24; pp. 59-64; 2003.

*Primary Examiner* — Nitin Parekh
(74) *Attorney, Agent, or Firm* — Snell & Wilmer LLP (57) ABSTRACT

The present invention is an apparatus for integrating multiple devices. The apparatus includes a substrate having a first via and a second via, a semiconductor chip positioned on a top portion of the substrate and positioned between the first via and the second via, first and second bumps positioned on the semiconductor chip, and an interposer wafer having a first interposer spring assembly and a second interposer spring assembly, the first interposer spring assembly having a first interposer spring and a first electrical connection attached to the first interposer spring, and the second interposer spring assembly having a second interposer spring and a second electrical connection attached to the second interposer spring.

20 Claims, 6 Drawing Sheets

U.S. PATENT DOCUMENTS

| | | |
|---|---|---|
| 2004/0183207 A1 | 9/2004 | Jeung et al. |
| 2004/0262742 A1* | 12/2004 | DiStefano et al. ............ 257/706 |
| 2005/0026351 A1 | 2/2005 | Farrar |
| 2005/0035347 A1* | 2/2005 | Khandros et al. ............... 257/48 |
| 2007/0144841 A1 | 6/2007 | Chong et al. |
| 2007/0259539 A1 | 11/2007 | Brown et al. |
| 2007/0269997 A1 | 11/2007 | Eldridge et al. |
| 2008/0061808 A1 | 3/2008 | Mok et al. |
| 2008/0090429 A1 | 4/2008 | Mok et al. |
| 2008/0157799 A1 | 7/2008 | Gritters et al. |
| 2008/0253098 A1* | 10/2008 | Liu ............................... 361/771 |
| 2009/0085191 A1 | 4/2009 | Najafi et al. |
| 2009/0142707 A1 | 6/2009 | Eldridge et al. |
| 2009/0153165 A1 | 6/2009 | Chong et al. |

* cited by examiner

| MATERIAL SYSTEM | BONDING PROCESS | REMELT TEMP. |
|---|---|---|
| COPPER - TIN | 4 MIN AT 280 °C | > 415°C |
| SILVER - TIN | 60 MIN AT 250 °C | > 600°C |
| SILVER - INDIUM | 120 MIN AT 175 °C | > 880°C |
| GOLD - TIN | 15 MIN AT 260 °C | > 278°C |
| GOLD - INDIUM | 0.5 MIN AT 200 °C | > 495°C |
| NICKEL - TIN | 6 MIN AT 300 °C | > 400°C |

COMPLIANT SPRING INTERPOSER FOR WAFER LEVEL THREE DIMENSIONAL (3D) INTEGRATION AND METHOD OF MANUFACTURING

BACKGROUND

1. Field

The invention relates to an interposer module that bridges chips (or wafers) to a substrate and routes interconnection lines. More particularly, the invention relates to a compliant spring interposer for wafer level three dimensional (3D) integration and method of manufacturing the same.

2. Background

An interposer module (also called an interposer wafer) is used to bridge or connect multiple devices, chips or wafers to a substrate. Designing an interposer module is difficult because the interposer module needs to account for different sized and shaped devices having different topologies. Heterogeneous integration requires the interposer module to incorporate different sized and shaped devices that generally have different topologies. For example, the difference in device heights makes the design of the interposer module challenging because the designer needs to adjust the vertical topology of the interposer module to be exactly matched with the device heights. This requires accurate control of the fabrication process.

In addition, the interposer module has limits in selecting bonding methods and requires multiple bonding. Heterogeneous integration generally requires multiple bonding processes. The bonding process becomes more frequent as the number of devices increases. The difficulty becomes more challenging when the devices are stacked in a three-dimensional (3D) orientation.

Existing interposer modules have several drawbacks. For example, the different device topologies have different device heights making it difficult to properly integrate the devices. To modulate the different heights, prior methods involved stacking bump materials or using bonding methods that compress bonding material. However, both methods are difficult because these methods do not allow for accurate control of the fabrication process. Furthermore, even though the device topologies for integration can be adjusted or involves identically designed devices, the device topologies can be diverse because of fabrication variations. This diversity cannot be controlled and the process should be designed to compensate for the unpredictable difference in wafer surface profile, material deposition thickness, material etching rate, wafer bowing, etc.

Another drawback is the number of different bonding processes required for the different devices. Typically, as the number of devices increase, so does the number of bonding processes. The multiple bonding processes involve different bonding steps, materials and conditions such as temperature, pressure, voltage, etc. The sequence of bonding processes should be carefully designed and controlled so that latter bonding methods do not damage former bonding materials and former bonding methods do not generate any issues to disturb the latter bonding conditions. The multiple bonding processes also generate several thermal cycles, which can produce problems such as device stress, wafer bowing, material oxidation, inter-material reaction, outgasing, and material damages.

In some situations, the devices need to be encapsulated to protect them from damage or contamination created by dust, debris, particles, humidity or chemicals. Some applications need a hermetically sealed vacuum package to improve device performance and reliability. These goals are generally achieved by employing additional wafers that cap the devices, which, however, increase fabrication complexity and cost and produce yield problems.

The above drawbacks provide challenges to designers of interposer modules. Thus, there is a need for an interposer module that overcomes the above drawbacks.

SUMMARY

In one embodiment, the present invention is an apparatus for integrating multiple devices. The apparatus includes a substrate having a first via and a second via, a semiconductor chip positioned on a top portion of the substrate and positioned between the first via and the second via, first and second bumps positioned on the semiconductor chip, and an interposer wafer having a first interposer spring assembly and a second interposer spring assembly, the first interposer spring assembly having a first interposer spring and a first electrical connection attached to the first interposer spring, and the second interposer spring assembly having a second interposer spring and a second electrical connection attached to the second interposer spring.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements.

Figure 1A:
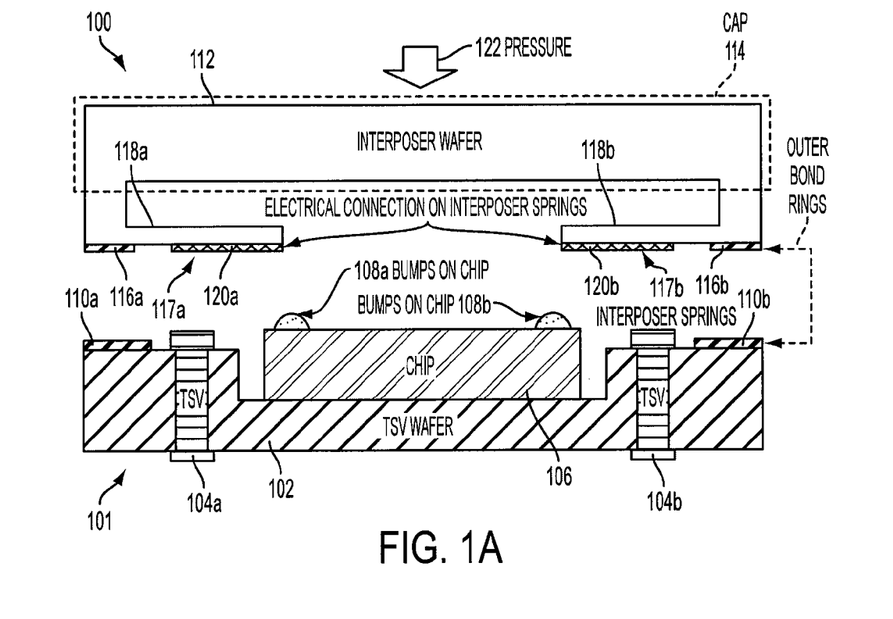
FIG. 1A is a cross-sectional view of a device and an apparatus that incorporates interposer technology where the apparatus is spaced apart from the device according to an embodiment of the invention.
Figure 1B:
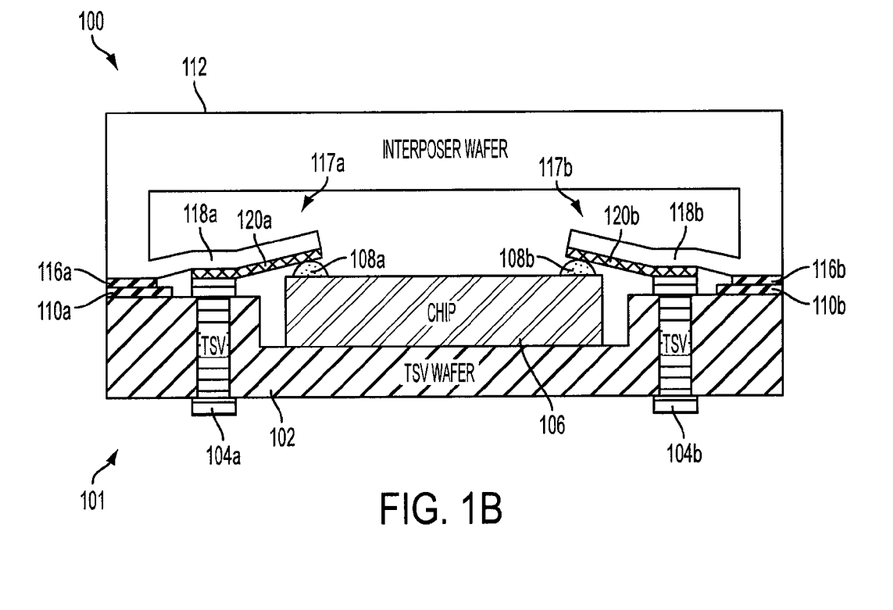
FIG. 1B is a cross-sectional view of a device and an apparatus that incorporates interposer technology where the apparatus is bonded to the device according to an embodiment of the invention.

FIG. 1A is a cross-sectional view of a device 101 and an apparatus 100 that incorporates interposer technology where the apparatus 100 is spaced apart from the device 101 according to an embodiment of the invention. The apparatus 100 may be positioned on the device 101 as shown in FIG. 1B. The device 101 may include a substrate 102 or a through-silicon via (TSV) wafer 102, first and second TSVs 104a and 104b, a chip 106, first and second bumps 108a and 108b, and/or first and second lower outer bond rings 110a and 110b. The first and second bumps 108a and 108b may provide electrical connections to the underlying chip 106. The first and second lower outer bond rings 110a and 110b may be a single lower outer bond ring. As shown in FIG. 1A, the heights of the first and second TSVs 104a and 104b, the first and second bumps 108a and 108b, and the first and second lower outer bond rings 110a and 110b are different.

The first and second TSVs 104a and 104b are vertical electrical connections which pass completely through the TSV wafer 102. The chip 106 is mounted on the TSV wafer 102. The first and second TSVs 104a and 104b and the first and second bumps 108a and 108b may be flat or curved and/or flexible. The first and second bumps 108a and 108b may be bonded to the chip 106.

The apparatus 100 may include an interposer wafer 112, a cap 114, first and second upper outer bond rings 116a and 116b, a first interposer spring assembly 117a having a first interposer spring 118a and a first electrical connection 120a, and a second interposer spring assembly 117b having a second interposer spring 118b and a second electrical connection 120b. In one embodiment, the first and second interposer springs 118a and 118b are cantilevered springs or interposer beams. The first and second interposer springs 118a and 118b may be formed in the shapes of a cantilevered bridge L shape or curved shape or crab leg shape and are made from a ceramic, a silicon, a metal or a glass material and combinations thereof. The downward force 122 exerted on each interposer spring 118a or 118b is greater than the bending force of each interposer spring 118a or 118b and less than the fracture force of each interporser spring 118a or 118b. The minimum downward force 122 can also be greater than the bonding force needed to bond the first upper outer bonding ring 116a to the first lower outer bonding ring 110a. The first and second upper outer bond rings 116a and 116b may be a single upper outer bond ring.

The apparatus 100 may be referred to as a compliant interposer. The apparatus 100 can be separately fabricated from the device 101. Thus, the design and fabrication processes for the apparatus 100 can be simplified and decoupled from the device 101. In addition, the apparatus 100 (i.e., the interposer wafer) can be used as a cap 114 or a cover to protect the device 101 from contamination such as dust, debris or particles. The first and second upper outer bond rings 116a and 116b may be hermetically bonded to the first and second lower outer bond rings 110a and 110b to produce a hermetically packaged apparatus or chip.

FIG. 1B is a cross-sectional view of the device 101 and the apparatus 100 that incorporates interposer technology where the apparatus 100 is bonded to the device 101 according to an embodiment of the invention. As shown in FIG. 1B, the first interposer spring assembly 117a and the second interposer spring assembly 117b may gradually bend when each assembly 117a and 117b comes into contact with the first and second TSVs 104a and 104b, the first and second bumps 108a and 108b located on the chip 106 and/or the first and second lower outer bond rings 110a and 110b. The bending allows the apparatus 100 to accommodate for the height differences of the components of the device 101 and to provide for good bonding and mechanical and electrical connections.

The first electrical connection 120a is mechanically connected to the first interposer spring 118a. The first interposer spring 118a is capable of bending to allow the first electrical connection 120a to electrically contact the first TSV 104a and the first bump 108a, which is connected to the chip 106. Similarly, the second electrical connection 120b is connected to the second interposer spring 118b. The second interposer spring 118b is capable of bending to allow the second electrical connection 120b to electrically contact the second TSV 104b and the second bump 108b, which is connected to the chip 106. The first and second interposer springs 118a and 118b provide an electrical and mechanical bridge to connect the first and second TSVs 104a and 104b to the first and second bumps 108a and 108b on the chip 106. A larger bonding pressure 122 can be applied to the interposer wafer 112, which is transferred to the TSVs 104a and 104b and the first and second bumps 108a and 108b, because of the flexibility and bending force of the first and second interposer springs 118a and 118b.

The first and second electrical connections 120a and 120b are in direct mechanical and electrical contact with the first and second TSVs 104a and 104b and the first and second bumps 108a and 108b located on the chip 106. Specifically, the first electrical connection 120a connects the first TSV 104a to the first bump 108a and the second electrical connection 120b connects the second TSV 104b to the second bump 108b.

The bonding pads (e.g., the first and second TSVs 104a and 104b, the first and second bumps 108a and 108b, and/or the first and second lower outer bond rings 110a and 110b) are designed to provide good electrical connections and to withstand large bending pressures provided by the interposer wafer 112. The first and second TSVs 104a and 104b and the first and second bumps 108a and 108b may have a flat or curved surface, or may be formed in the shape of a square, rectangle or oval and/or may be made of a flexible material to allow for good connections to the first and second electrical connection 120a and 120b and to avoid any open connections across the TSV wafer 102. The good connections are achieved by adjusting or controlling the height of the bonding pads and/or by utilizing compliant and conductive materials such as soft metals like gold, silver, tin, aluminum or copper. The compliant and conductive materials should not be oxidized and should be chemically stable during processing. For example, copper may quickly become oxidized after deposition but can be encapsulated or plated with a less-oxidizing material such as gold. Hence, the bonding pads can be encapsulated or plated with a less-oxidizing material. Also, the compliant and conductive material should be able to sustain high pressures from the first and second interposer springs 118a and 118b, which may induce cracks or fractures.

After the apparatus 100 is pressed onto the device 101, all the TSVs 104a and 104b, the first and second bumps 108a and 108b, the first and second interposer springs 118a and 118b, the first and second electrical connections 120a and 120b, the lower outer bond rings 110a and 110b, and the upper outer bond rings 116a and 116b are simultaneously bonded together in a single bonding step. Hence, all the components are fixed and bonded together at the same time to limit the number of bonding materials, minimize misalignment of the components, reduce the complexity of the fabrication process and increase the reliability of the apparatus 100 after the single step bonding process. The single bonding step includes the appropriate bonding conditions such as temperature, pressure and/or voltage.

Figure 2:
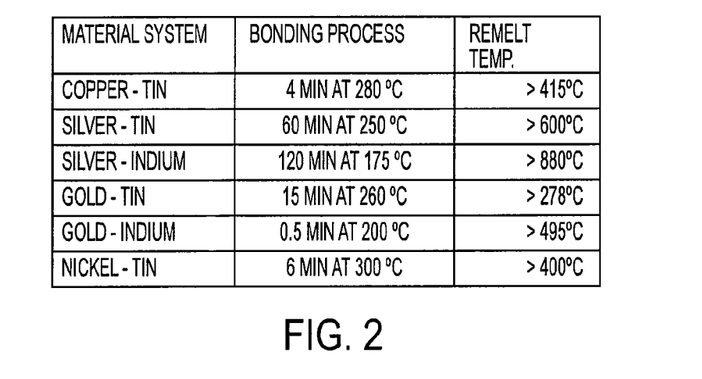
FIG. 2 is a chart of several bonding materials and their corresponding bonding process according to an embodiment of the invention.

FIG. 2 is a chart of several bonding materials and their corresponding bonding process according to an embodiment of the invention. In one embodiment, the bonding process can be set up so that each component bonds one after another. In this embodiment, a different bonding material or process is used for each component. FIG. 2 shows several different bonding materials and processes that can be used for each of the components to produce a bonding process where each component may bond one after another (i.e., in a sequential manner). For example, a sequential bonding process can occur by increasing the bonding temperature from 200 degrees C. to 300 degrees C. so that a first Gold-Indium bond occurs between the lower outer bond rings 110a and 110b and the upper outer bond rings 116a and 116b, a second Silver-Tin bond occurs between the TSVs 104a and 104b and the first and second interposer springs 118a and 118b, and a third Nickel-Tin bond occurs between the first and second bumps 108a and 108b and the first and second interposer springs 118a and 118b. In this example, the highest bonding temperature of 300 degrees C. does not damage the first Gold-Indium bond because of a higher remelt temperature of greater than 495 degrees C. Using a sequential bonding process, the selection of the bonding materials and processes is important so that previously bonded materials are not damaged by subsequent bonding materials in order to maintain good quality bonding.

Figure 1C:
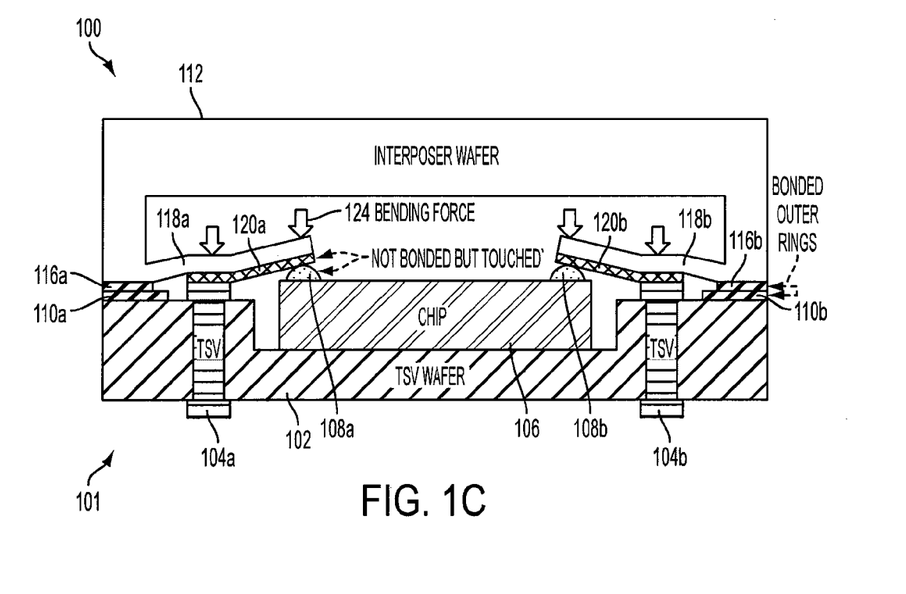
FIG. 1C is a cross-sectional view of a device and an apparatus that incorporates interposer technology where the first and second interposer springs are not bonded to but are touching the first and second TSVs and the first and second bumps located on the chip of the device according to an embodiment of the invention.

FIG. 1C is a cross-sectional view of a device 101 and an apparatus 100 that incorporates interposer technology where the first and second interposer springs 118a and 118b are not bonded to but are touching the first and second TSVs 104a and 104b and the first and second bumps 108a and 108b located on the chip 106 of the device 101 according to an embodiment of the invention. When the apparatus 100 is pressed onto the device 101, the TSVs 104a and 104b and the first and second bumps 108a and 108b are mechanically and electrically connected using the first and second interposer springs 118a and 118b and the upper outer bond rings 116a and 116b are bonded to the lower outer bond rings 110a and 110b.

When the apparatus 100 is spaced apart from (i.e., not touching) the device 101, the first and second interposer springs 118a and 118b are positioned along a horizontal plane (see FIG. 1A). When the apparatus 100 is touching the device 101, the first and second interposer springs 118a and 118b are bent in an upward direction (see FIG. 1C). As shown in FIG. 1C, the upper outer bond rings 116a and 116b are bonded to the lower outer bond rings 110a and 110b causing the first and second interposer springs 118a and 118b to bend. However, the first and second interposer springs 118a and 118b only slightly compress the TSVs 104a and 104b and the first and second bumps 108a and 108b to make the mechanical and electrical connections. In one embodiment, the mechanical and electrical connections are maintained only by the bending force 124 from the first and second interposer springs 118a and 118b and the bonding strength between the upper outer bond rings 116a and 116b and the lower outer bond rings 110a and 110b. The single bonding between the upper outer bond rings 116a and 116b and the lower outer bond rings 110a and 110b is advantageous because of the single bonding material and process resulting in a greater reliability, a simpler fabrication process, and a lower production cost. In one embodiment, the first and second interposer springs 118a and 118b are designed to provide a sufficient bending force and are not damaged by excessive bending stress.

In one embodiment, only the lower outer bond rings 110a and 110b and the upper outer bond rings 116a and 116b are bonded together. The remaining components (i.e., the TSVs 104a and 104b and the first and second interposer springs 118a and 118b, and the first and second bumps 108a and 108b and the first and second interposer springs 118a and 118b) are not bonded together but are touching one another.

FIGS. 3A-3F are cross-sectional views of a device 301 and an apparatus 300 that incorporates interposer technology according to an embodiment of the invention. The device 301 includes a substrate 302 and a plurality of chips 306, 307 and 309 that are mounted on the substrate 302. The substrate 302 may also be a TSV wafer or a second interposer wafer.

Figure 3A:
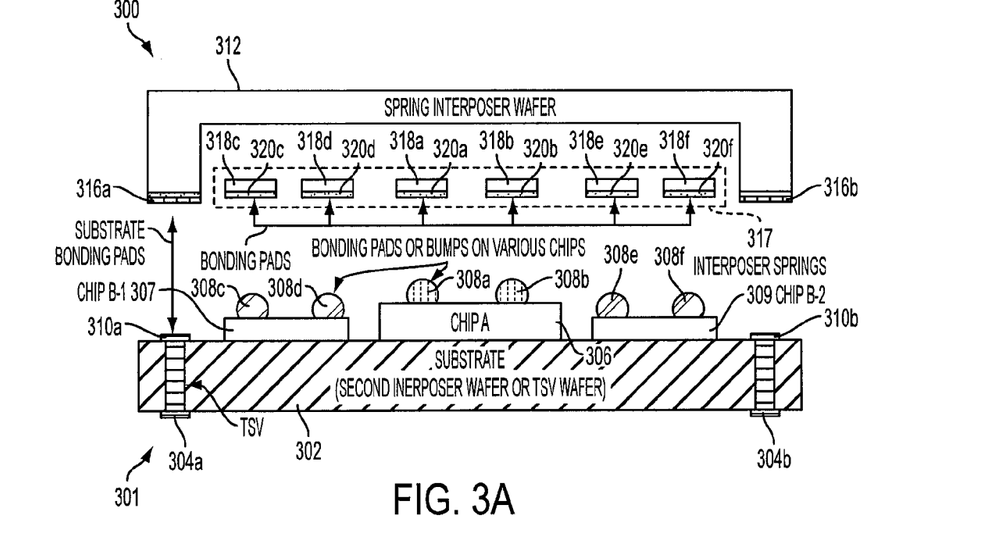
FIGS. 3A-3F are cross-sectional views of a device and an apparatus that incorporates interposer technology according to an embodiment of the invention.
Figure 3B:
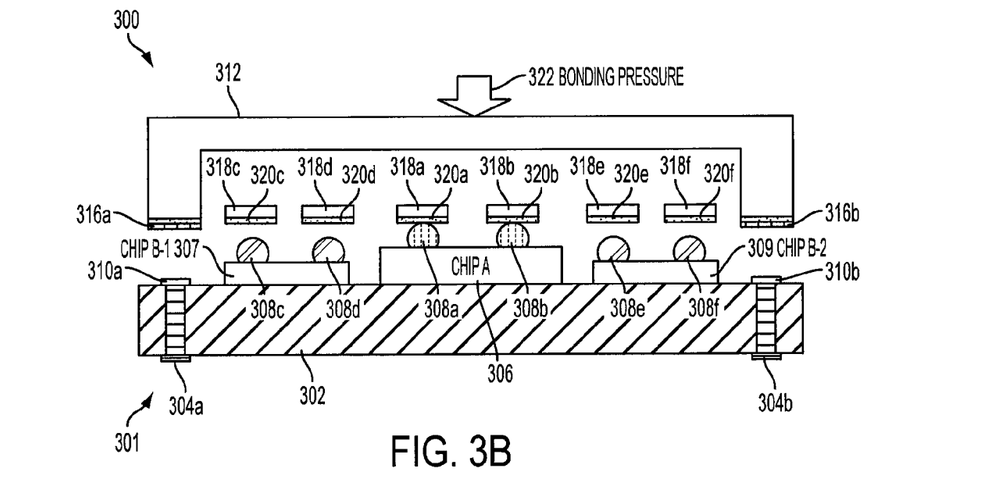
Figure 3C:
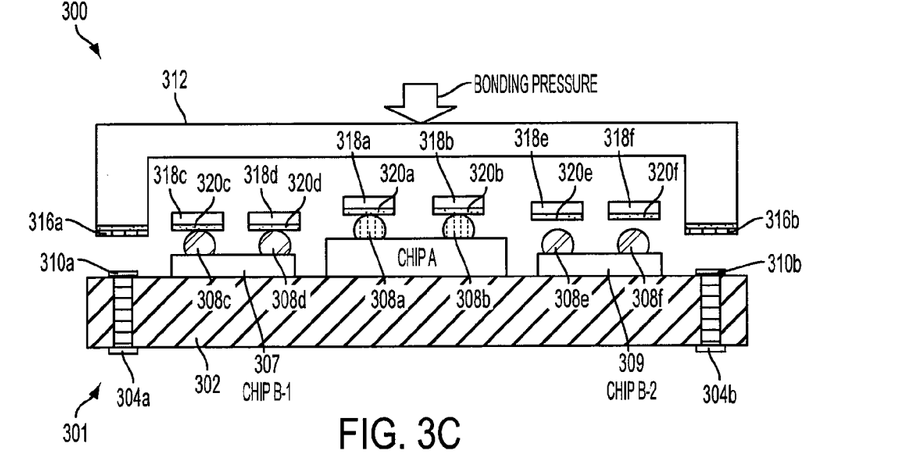
Figure 3D:
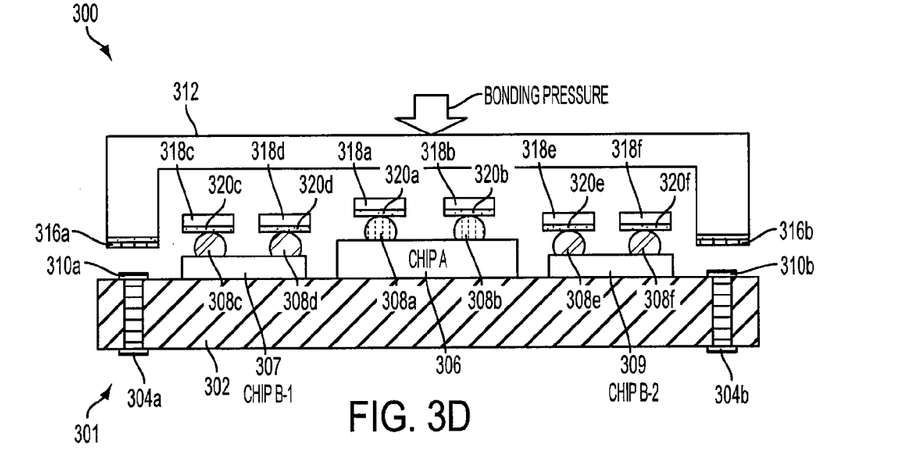
Figure 3E:
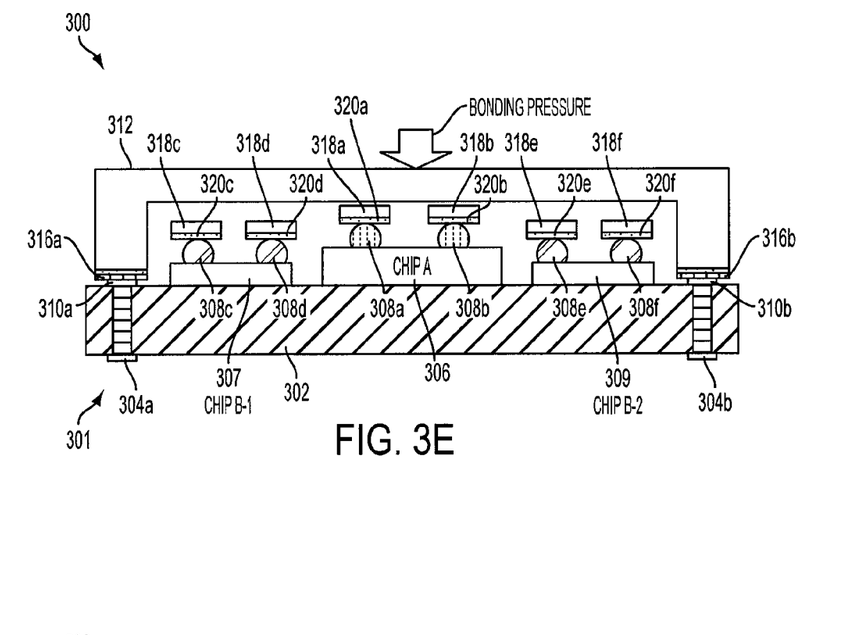

The device 301 may include a substrate 302 or a TSV wafer 302, first and second TSVs 304a and 304b, chips 306, 307 and 309, first and second bumps 308a and 308b located on the chip 306, first and second bumps 308c and 308d located on the chip 307, first and second bumps 308e and 308f located on the chip 309, upper bonding pads 316a and 316b and/or lower bonding pads 310a and 310b. The first and second bumps 308a and 308b (or 308c and 308d or 308e and 308f) may provide electrical connections to the underlying chip 306 (or 307 or 309). As shown in FIG. 3A, the heights or thickness of the chips 306, 307 and 309 are different. In one embodiment, the chips 307 and 309 have the same design but have slightly different heights or thicknesses because of fabrication variations. The bonding pads 320a, 320b, 320c, 320d, 320e and 320f on the interposer springs 318a, 318b, 318c, 318d, 318e and 318f, respectively, are mechanically and electrically connected to the upper bonding pads 310b and 316b. After the upper bonding pads 316a and 316b are bonded to the lower bonding pads 310a and 310b, the bonding pads 320a, 320b, 320c, 320d, 320e and 320f are connected to the bumps 308a, 308b, 308c, 308d, 308e and 308f, respectively, and the TSVs 304a and 304b on the substrate 302.

The first and second TSVs 304a and 304b are vertical electrical connections which pass completely through the substrate 302. The chips 306, 307 and 309 are mounted on the substrate 302. The bumps 308a, 308b, 308c, 308d, 308e and 308f may be flat, square, curved, round, oval and/or flexible. The first and second bumps 108a and 108b may be bonded to the chip 106.

The apparatus 300 may include a spring interposer wafer 312, first and second upper bonding pads 316a and 316b, and a plurality of interposer springs 318 connected to a plurality of bonding pads 320. In one embodiment, the plurality of interposer springs 318 are each a cantilevered spring.

Figure 3F:
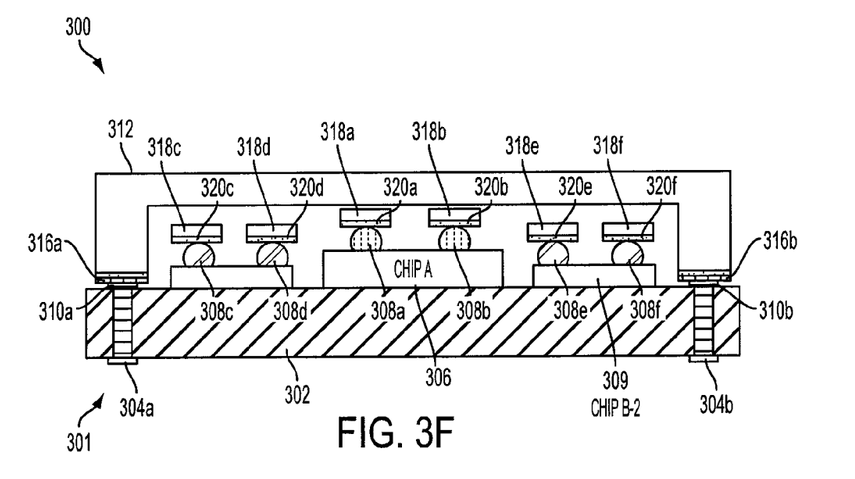

By applying the bonding pressure 322, the bonding pads successively touch the bumps on the chips or the TSVs. The differences in heights or thicknesses of the chips 306, 307 and 309 causes the bonding pads 320 to touch the bonding pads 308 at different times. First, the bonding pads 320a and 320b touch the bonding pads 308a and 308b (see FIG. 3B). Second, the bonding pads 320c and 320d touch the bonding pads 308c and 308d (see FIG. 3C). Third, the bonding pads 320e and 320f touch the bonding pads 308e and 308f (see FIG. 3D). Fourth, the upper bonding pads 316a and 316b touch the lower bonding pads 310a and 310b (see FIG. 3E). Due to the compliance of the interposer springs 318, the spring interposer wafer 312 can move downwards, even though some of the bonding pads 320 are touching the bonding pads 308, until the upper bonding pads 316a and 316b come into contact with the lower bonding pads 310a and 310b (see FIG. 3E). Then, the appropriate bonding conditions (e.g., temperature, additional pressure, voltage, etc.) are applied to the combined structure shown in FIG. 3E and all the components (i.e., the chips 306, 307 and 309, the TSVs 304a and 304b, and the interposer springs (collectively referred as interposer springs 317)) are simultaneously bonded to form the final structure as shown in FIG. 3F.

The bonding conditions may be applied one time or several times depending on the particular application. For example, a different bonding process may be used for chip bonding and TSV bonding. In this example, a first bonding condition may be applied for chip bonding at the step shown in FIG. 3D and a second bonding condition may be applied for TSV bonding at the step shown in FIG. 3E. In one embodiment, only a single bonding can take place, for example, between the upper bonding pads 316a and 316b and the lower bonding pads 310a and 310b. The interposer springs 317 are designed to be flexible to provide sufficient bonding force without damaging the bonding pads 308.

Figure 4A:
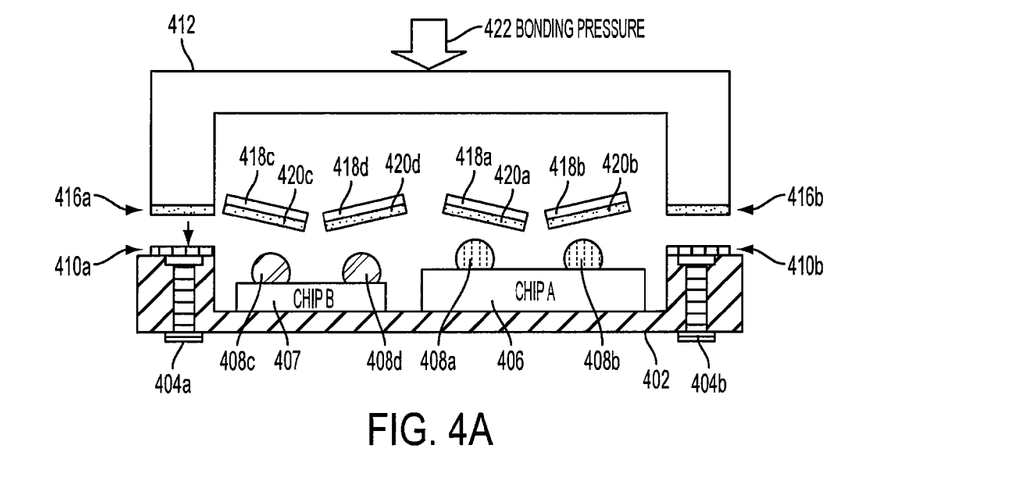
FIGS. 4A and 4B are cross-sectional views of a device and an apparatus that incorporates interposer technology according to an embodiment of the invention.
Figure 4B:
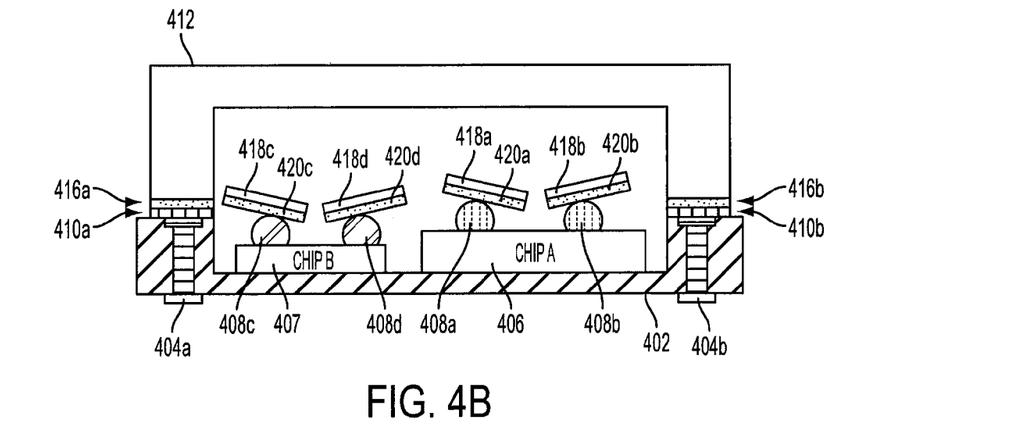

FIGS. 4A and 4B are cross-sectional views of a semiconductor device 401 and an apparatus 400 that incorporates interposer technology according to an embodiment of the invention. FIGS. 4A and 4B show interposer springs 418a, 418b, 418c and 418d that are initially tilted or bowed to provide a larger bending force between the interposer springs 418a, 418b, 418c and 418d and the bumps 408a, 408b, 408c and 408d and/or the TSVs 404a and 404b. The interposer springs 418a, 418b, 418c and 418d can be tilted or bowed by initiating thermal stress, generating material property mismatches, or applying external forces such as electrostatic or magnetic forces. Each interposer spring 418a, 418b, 418c and 418d may have a corresponding bonding pad 420a, 420b, 420c and 420d attached thereto.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An apparatus for integrating multiple devices, comprising:
   a substrate having a first via and a second via;
   a semiconductor chip positioned on a top portion of the substrate and positioned between the first via and the second via;
   first and second bumps positioned on the semiconductor chip; and
   an interposer wafer having a first interposer spring and a first electrical connection attached to the first interposer spring, the first electrical connection being in contact with the first via and the first bump and providing an electrical connection between the first via and the first bump, and a second interposer spring and a second electrical connection attached to the second interposer spring, the second electrical connection being in contact with the second via and the second bump and providing an electrical connection between the second via and the second bump.

2. The apparatus of claim 1 wherein the substrate is a through-silicon via wafer.

3. The apparatus of claim 1 wherein the first via and the second via are vertical electrical connections that pass completely through the substrate.

4. The apparatus of claim 1 wherein the first and second bumps are bonded to the semiconductor chip and provide an electrical connection to the semiconductor chip.

5. The apparatus of claim 1 wherein the first and second interposer springs are cantilevered springs.

6. The apparatus of claim 1 wherein the first and second interposer springs are formed in the shape of a cantilevered bridge L shape.

7. The apparatus of claim 1 wherein the first interposer spring is bent to provide the first electrical connection between the first via and the first bump and the second interposer spring is bent to provide the second electrical connection between the second via and the second bump.

8. The apparatus of claim 1 further comprising:
   a lower bond ring attached to an outer top portion of the substrate; and
   an upper bond ring attached to an outer bottom portion of the interposer wafer.

9. The apparatus of claim 8 wherein the first and second interposer springs are bent when the upper bond ring is attached to the lower bond ring.

10. The apparatus of claim 1 further comprising a pressure device to exert a downward force on the interposer wafer, the downward force being greater than a bending force of each interposer spring and less than a fracture force of each interposer spring.

11. An apparatus for integrating multiple devices, comprising:
    a substrate having a first via and a second via;
    a semiconductor chip positioned on a top portion of the substrate and positioned between the first via and the second via;
    first and second bumps positioned on the semiconductor chip; and
    an interposer wafer having a first interposer spring assembly and a second interposer spring assembly, the first interposer spring assembly having a first interposer spring and a first electrical connection attached to the first interposer spring, the first electrical connection being in contact with the first via and the first bump and providing an electrical connection between the first via and the first bump, and the second interposer spring assembly having a second interposer spring and a second electrical connection attached to the second interposer spring, the second electrical connection being in contact with the second via and the second bump and providing an electrical connection between the second via and the second bump.

12. The apparatus of claim 11 wherein the substrate is a through-silicon via wafer.

13. The apparatus of claim 11 wherein the first via and the second via are vertical electrical connections that pass completely through the substrate.

14. The apparatus of claim 11 wherein the first and second bumps are bonded to the semiconductor chip and provide an electrical connection to the semiconductor chip.

15. The apparatus of claim 11 wherein the first and second interposer springs are cantilevered springs.

16. The apparatus of claim 11 wherein the first and second interposer springs are formed in the shape of a cantilevered bridge L shape.

17. The apparatus of claim 11 wherein the first interposer spring is bent to provide the first electrical connection between the first via and the first bump and the second interposer spring is bent to provide the second electrical connection between the second via and the second bump.

18. The apparatus of claim 11 further comprising:
a lower bond ring attached to an outer top portion of the substrate; and
an upper bond ring attached to an outer bottom portion of the interposer wafer.

19. The apparatus of claim 18 wherein the first and second interposer springs are bent when the upper bond ring is attached to the lower bond ring.

20. The apparatus of claim 11 further comprising a pressure device to exert a downward force on the interposer wafer, the downward force being greater than a bending force of each interposer spring and less than a fracture force of each interposer spring.

* * * * *